United States Patent
Min et al.

(10) Patent No.: US 8,137,470 B2
(45) Date of Patent: Mar. 20, 2012

(54) INNER PLATE AND CRUCIBLE ASSEMBLY FOR DEPOSITION HAVING THE SAME

(75) Inventors: Kyung-Soo Min, Suwon-si (KR); Chang-Soon Ji, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 722 days.

(21) Appl. No.: 12/318,408

(22) Filed: Dec. 29, 2008

(65) Prior Publication Data

US 2010/0043710 A1    Feb. 25, 2010

(30) Foreign Application Priority Data

Aug. 22, 2008    (KR) ........................ 10-2008-0082266

(51) Int. Cl.
     *C23C 16/00*    (2006.01)
     *B01D 1/00*    (2006.01)
     *B01D 3/04*    (2006.01)
     *C10G 1/02*    (2006.01)
     *C10G 9/18*    (2006.01)

(52) U.S. Cl. ........ 118/726; 118/727; 159/28.6; 196/111

(58) Field of Classification Search .................. 118/726, 118/727; 159/28.6; 196/111
See application file for complete search history.

(56) References Cited

U.S. PATENT DOCUMENTS

| | | | |
|---|---|---|---|
| 6,202,591 B1 * | 3/2001 | Witzman et al. | 118/723 VE |
| 6,270,839 B1 * | 8/2001 | Onoe et al. | 427/248.1 |
| 2004/0035366 A1 * | 2/2004 | Keum et al. | 118/726 |
| 2004/0040660 A1 | 3/2004 | Biberger et al. | |
| 2007/0074654 A1 | 4/2007 | Lee et al. | |
| 2007/0148348 A1 | 6/2007 | Huh et al. | |

FOREIGN PATENT DOCUMENTS

| | | |
|---|---|---|
| CN | 1599807 A | 3/2005 |
| CN | 2788350 Y | 6/2006 |
| CN | 1940123 A | 4/2007 |
| CN | 1990902 A | 7/2007 |

(Continued)

OTHER PUBLICATIONS

Chinese Office Action, dated Dec. 7, 2010, corresponding to the Chinese Patent Application No. 200910009757.6, together with Request for Entry.

Korean Office Action issued by KIPO dated Aug. 2, 2010 corresponding to Korean Priority Application No. 10-2008-0082266 together with Request for Entry.

(Continued)

*Primary Examiner* — Keath Chen
(74) *Attorney, Agent, or Firm* — Robert E. Bushnell, Esq.

(57) ABSTRACT

A crucible assembly for deposition and an inner plate used in the crucible assembly. The crucible assembly includes a main body having an inner space accommodating a deposition material and an opening arranged at an upper portion of the inner space, a cap having an aperture arranged at a top of the main body and combined with the main body and an inner plate arranged between the main body and the cap, the inner plate covering the opening of the main body, the crucible assembly including inner channels arranged to allow vapor of the deposition material from the inner space of the main body to be expelled to an outside of the aperture in the cap via a space arranged between an outer side surface of the inner plate and an inner side surface of the cap.

12 Claims, 3 Drawing Sheets

FOREIGN PATENT DOCUMENTS

| | | | |
|---|---|---|---|
| KR | 0691025 | B1 | 2/2007 |
| KR | 0700497 | B1 | 3/2007 |
| KR | 100700497 | B1 | 3/2007 |
| KR | 20070028183 | A | 3/2007 |
| KR | 1020070028183 | A | 3/2007 |
| KR | 20070066232 | A | 6/2007 |
| WO | 2007069865 | A1 | 6/2007 |

OTHER PUBLICATIONS

Korean Office Action issued by KIPO, dated Jan. 27, 2011, corresponding to Korean Patent Application No. 10-2008-0082266 together with Request for Entry.

Chinese Office action issued by Chinese Patent Office on Oct. 12, 2011, corresponding to Chinese Patent No. 200910009757.6 and its English Translation attached herewith.

* cited by examiner

INNER PLATE AND CRUCIBLE ASSEMBLY FOR DEPOSITION HAVING THE SAME

CLAIM OF PRIORITY

This application makes reference to, incorporates the same herein, and claims all benefits accruing under 35 U.S.C. §119 from an application for INNER PLATE AND CRUCIBLE ASSEMBLY FOR DEPOSITION HAVING THE SAME earlier filed in the Korean Intellectual Property Office on 22 Aug. 2008 and there duly assigned Serial No. 10-2008-0082266.

BACKGROUND OF THE INVENTION

1. Field of the Invention

The present invention relates to a crucible assembly for deposition of an organic thin film or a conductive layer, and an inner plate used in the crucible assembly.

2. Description of Related Art

In general, physical vapor deposition (PVD), such as vacuum deposition, ion-plating, sputtering, and chemical vapor deposition (CVD) through a reaction of gases are well known as a methods of forming a thin film on a substrate. Among them, the vacuum deposition can be used to form a thin film such as an electrode or an organic film for an organic light emitting device.

Vacuum deposition is a technique for forming a thin film using an evaporation source provided at a lower portion of a vacuum chamber and a substrate for film formation provided at an upper portion of the vacuum chamber. Generally, in a thin film forming apparatus using vacuum deposition, the interior of a vacuum chamber is maintained under a predetermined vacuum atmosphere using a vacuum pump, and a deposition material, which is a thin film material, is then evaporated from an evaporation source located at a lower portion of the vacuum chamber. A substrate for film formation located at a predetermined distance from the evaporation source is positioned within the interior of the vacuum chamber. Therefore, the deposition material evaporated from a crucible travels to the substrate and is solidified on the substrate for film formation through consecutive processes including absorption, deposition, re-evaporation and the like, thereby forming a thin film.

An effusion cell using an induction heating method, which is called an indirect heating method, is frequently used as an evaporation source for the vacuum deposition. The effusion cell includes a crucible having a deposition material accommodated within an interior thereof and a heater wound about an outer circumferential surface of the crucible to electrically heat the deposition material. A top of the crucible is opened so that vapor can be expelled to the outside of the crucible when the deposition material accommodated within the crucible is evaporated. A cap member provided with an aperture having a predetermined size is typically formed at an upper portion of the crucible so as to prevent the deposition material from being splashed to the outside of the effusion cell when the deposition material is evaporated. The cap member also serves to assure a reproducible thickness of a film on the substrate for film formation.

However, in the effusion cell used in the aforementioned thin film forming apparatus, heat loss at the upper portion of the crucible is generated by the aperture in the cap member formed at the upper portion of the crucible. The deposition material that evaporates within the interior of the crucible and then travels to the substrate for film formation can condense around the aperture due to the rapid variation in temperatures between the interior and the exterior of the cap member. As a result, the aperture of the cap member can become blocked by the condensed deposition material. The blockage of an aperture in the cap member can cause the deposition rate in a deposition process to become unstable. What is therefore needed is a design for a crucible assembly that does not allow the aperture in the cap assembly to become blocked.

SUMMARY OF THE INVENTION

Accordingly, it is an object of the present invention to provide a crucible assembly for deposition, which can prevent the crucible aperture from becoming blocked by increasing the internal pressure of the crucible assembly, resulting in an improved reliability of the deposition rate of the crucible assembly.

It is another object of the present invention to provide an inner plate for a crucible assembly for deposition which can serve to increase the internal pressure of the crucible assembly by changing the path of the vaporized deposition material within the crucible from a linear shape to a bypass curve shape.

According to an aspect of the present invention, the present invention provides a crucible assembly that includes a main body having an inner space accommodating a deposition material and an opening arranged at an upper portion of the inner space, a cap having an aperture arranged at a top of the main body and combined with the main body and an inner plate arranged between the main body and the cap, the inner plate covering the opening of the main body, the crucible assembly including inner channels arranged to allow vapor of the deposition material from the inner space of the main body to be expelled to an outside of the aperture in the cap via a space arranged between an outer side surface of the inner plate and an inner side surface of the cap.

The inner plate can include a base member, a partition wall arranged at a middle portion of the base member in a thickness direction of the base member, the partition to partition an interior of the base member into first and second floor spaces, an inlet allowing the first floor space to be exposed from a bottom side of the base member, an outlet allowing the second floor space to be exposed from a top side of the base member, a plurality of first channels to allow the first floor space to communicate with an outer side surface of the base member and a plurality of second channels to allow the second floor space to communicate with the outer side surface of the base member.

The inner channels can be arranged to allow the vapor to sequentially flow through the inlet, the first floor space, the first channels, the outer side surface of the base member, the second is channels, the second floor space and the outlet. The first channels can be radially arranged in a side surface of the base member. The second channels can be radially arranged in the side surface of the base member. The inlet can be arranged exposing an entirety of the first floor space from the bottom side of the base member. The base member can be made out of a material selected from a group consisting of copper, beryllium copper and phosphor bronze. The crucible assembly can also include a heater to supply heat to the main body, the heater being adhered to an outer circumferential surface of the main body.

According to another aspect of the present invention, there is provided an inner plate that includes a base member, a partition wall arranged at a middle portion of the base member in a thickness direction of the base member, the partition wall to partition an interior of the base member into first and second floor spaces, an inlet to allow the first floor space to be exposed from a bottom side of the base member, an outlet to allow the second floor space to be exposed from a top side of the base member, a plurality of first channels allowing the first floor space to communicate with an outer side surface of the base member and a plurality of second channels to allow the second floor space to communicate with the outer side surface of the base member, a plurality of inner channels being arranged to allow a fluid introduced through the inlet to sequentially flow through the inlet, the first floor space, the first channels, the outer side surface of the base member, the second channels, the second floor space and the outlet in order.

The first channels can be radially arranged in a side surface of the base member. The second channels can be radially arranged in a side surface of the base member. The inlet can be arranged exposing an entirety of the first floor space from the bottom side of the base member. The base member can include a material selected from a group consisting of copper, beryllium copper and phosphor bronze.

BRIEF DESCRIPTION OF THE DRAWINGS

A more complete appreciation of the invention and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
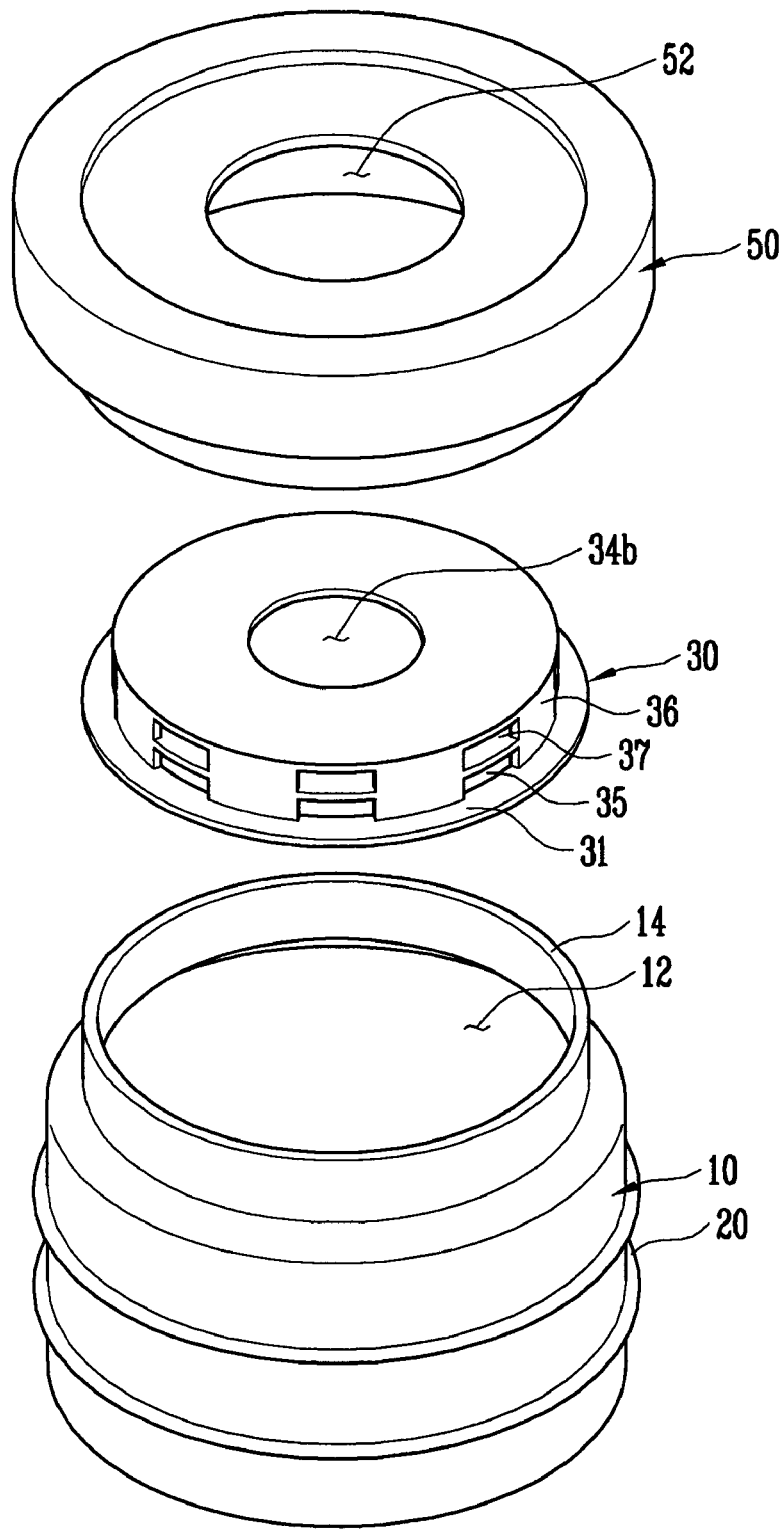
FIG. 1 is an exploded perspective view of a crucible assembly for deposition according to an embodiment of the present invention.

In the following detailed description, only certain exemplary embodiments of the present invention have been shown and described, simply by way of illustration. As those skilled in the art would realize, the described embodiments can be modified in various different ways, all without departing from the spirit or scope of the present invention. Accordingly, the drawings and description are to be regarded as illustrative in nature and not restrictive. In addition, when an element is referred to as being "on" another element, it can be directly on the another element or be indirectly on the another element with one or more intervening elements interposed therebetween. Also, when an element is referred to as being "connected to" another element, it can be directly connected to the another element or be indirectly connected to the another element with one or more intervening elements interposed therebetween. Hereinafter, like reference numerals refer to like elements.

Figure 2:
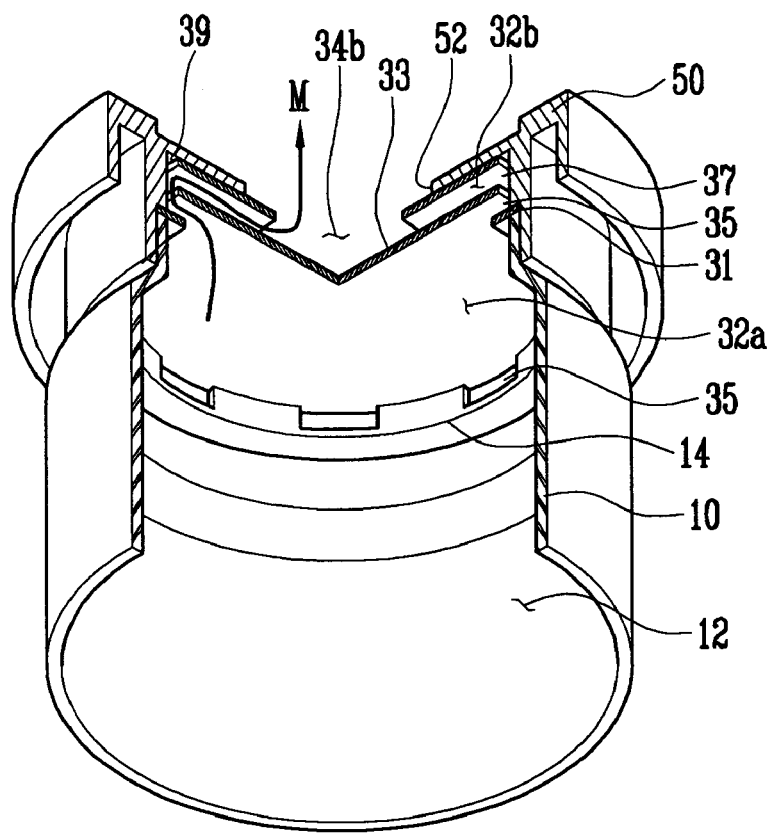
FIG. 2 is a partial cut-away perspective view of the crucible assembly of FIG. 1.
Figure 3:
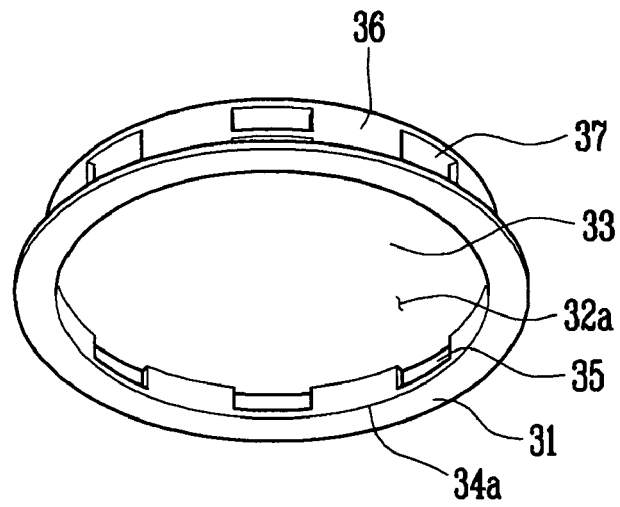
FIG. 3 is a perspective view of an inner plate used in the crucible assembly of FIG. 1.
Figure 4:
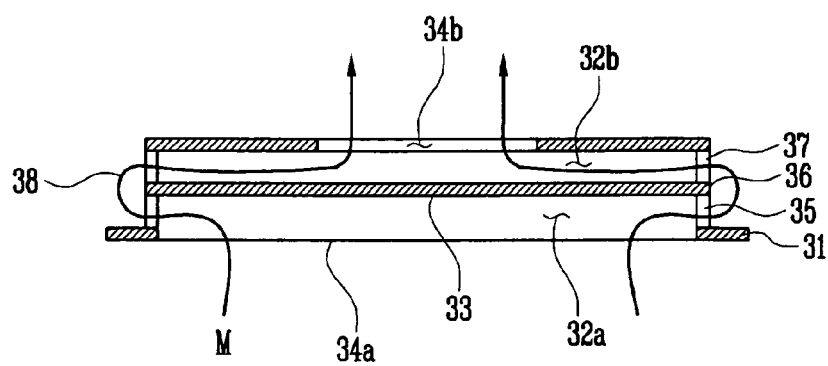
FIG. 4 is a transverse cross-sectional view of the inner plate of FIG. 3.

Turning now to FIGS. 1-4, FIG. 1 is an exploded perspective view of a crucible assembly for deposition according to an embodiment of the present invention, FIG. 2 is a partial cut-away perspective view of the crucible assembly of FIG. 1, FIG. 3 is a perspective view of an inner plate used in the crucible assembly of FIG. 1 and FIG. 4 is a transverse cross-sectional view of the inner plate of FIG. 3. The perspective view of FIG. 2 is a perspective view seen from a bottom side of the inner plate shown in FIG. 1.

Referring to FIGS. 1 to 4, the crucible assembly for deposition according to the embodiment of the present invention includes a main body 10, an inner plate 30 and a cap 50. The main body 10 has an inner space 12 in which a deposition material is accommodated and an opening 14 formed at an upper portion of the inner space 12 to allow an evaporated material to be expelled therethrough. The main body 10 is made of a material such as graphite, which can withstand high-temperature and high pressure.

The main body 10 also has a heater 20 that heats and evaporates a deposition material. The heater 20 can be combined with the main body 10 and have various shapes and structures so that heat can be applied to the main body 10. For example, the heater 20 can be fixedly adhered to an outer circumferential surface of the main body 10 to supply heat.

The cap 50 has an aperture 52 formed at a top thereof and is combined with an upper portion of the main body 10 with the inner plate 30 interposed therebetween. Preferably, the size of the aperture 52 is greater than that of an outlet 34b of the inner plate 30, which will be described below. When the cap 50 is combined with the main body 10, a flange portion 31 of the inner plate 30 is tightly adhered to a peripheral portion of the opening 14 of the main body 10 by the support of the cap 50.

The inner plate 30 has a flat-plate-shaped base member 36a made out of copper, beryllium copper, phosphor bronze and the like, and the flange portion 31 formed at an edge of a major surface of the base member 36a. The flange portion 31 is formed in a shape substantially identical to that of the opening 14 so as to cover all edges of the opening 14 when the inner plate 30 is arranged on the opening 14 of the main body 10. For example, when the main body 10 has an opening 14 having a circular, elliptic or hexagonal shape, the flange portion 31 can also be implemented in a shape similar to that of the opening 14.

The inner plate 30 has a partition wall 33 formed in a middle portion of the base member 36a in a thickness direction of the base member 36a so as to partition an interior of the base member 36a into first and second floor spaces 32a and 32b. The first floor space 32a is exposed at a bottom surface of the inner plate 30 by an inlet 34a provided at one surface of the base member 36a, and the second floor space 32b is exposed at a top side of the inner plate 30 by the outlet 34b provided at the other surface opposite to the one surface of the base member 36a. When the main body 10, the inner plate 30 and the cap 50 are combined together as shown in FIG. 2, the bottom side of the inner plate 30 faces the main body 10, and the top side of the inner plate 30 faces the cap 50.

The inner plate 30 also has first and second channels 35 and 37. The first channels 35 allow the first floor space 32a to be exposed to an outer side surface 36 of base member 36a in a radial direction of the inner plate 30. The second channels 37 allow the second floor space 32b to be exposed to the outer side surface 36 of base member 36a also in a radial direction. That is, the first channels 35 allow the first floor space 32a on an inner side of base member 36a to communicate with a space 39 on the outer side surface 36 of base member 36a, and the second channels 37 allow the second floor space 32b on an inner side of base member 36a to communicate with the space 39 on the outer side surface 36 of base member 36a. When the main body 10, the inner plate 30 and the cap 50 are combined together as shown in FIG. 2, the space 39 on the outer side surface 36 of base member 36a refers to a space formed between the outer side surface 36 of base member 36a the inner plate 30 and an inner side surface of the cap 50.

According to the aforementioned structure of the inner plate 30, a deposition material evaporated in an inner space of the main body 10 (hereinafter, also referred to as "vapor") is expelled to the outside of the main body 10 through inner channels 38 formed within inner plate 30. Here, the inner channels 38 refer to flow fields formed to allow the vapor to sequentially flow through the inlet 34a of the inner plate 30, the first floor space 32a, the first channels 35, the space 39 outside base member 36a, the second channels 37, the second floor space 32b and the outlet 34b of the inner plate 30 in order.

The deposition material can include an organic material for forming an organic layer or a conductive material for forming a conductive layer. The organic layer can include an emitter layer of an organic diode or electro luminescence (EL) device. The organic layer can further include an electron transfer layer, a hole transfer layer, a hole injection layer and an electron injection layer. The electron transfer layer, the hole transfer layer, the hole injection layer and the electron injection layer are organic thin films made of an organic compound. The conductive layer can include an anode or cathode produced by being laminated on the organic layer.

An operation of the crucible assembly for deposition according to the embodiment of the present invention will be described. As shown in FIGS. 2 and 4, a deposition material M that is heated and evaporated in the main body 10 is introduced into the first floor space 32a through the inlet 34a of the inner plate 30 located at the upper portion of the main body 10. This vaporized material then bends by about 90 degrees from a vertical z direction to a radial direction r within the first floor space 32a, causing the vapor to pass through first channels 35 in base member 36a and into space 39 on the outer side surface 36 of base member 36a. Then, the deposition material M makes a 180 degree turn from a +r direction to a −r direction within the space 39 on the outer side surface 36 of base member 36a so that the deposition material passes in the −r direction through second channels 37 in base member 36a and into second floor space 32b. Within second floor space 32b, the vapor path bends 90 degrees from a −r direction to a vertical direction z. Then, the vaporized deposition material M is expelled from second floor space 32b via outlet 34b and the vaporized deposition material M then passes through aperture 52 of the cap 50 above the second floor space 32b.

According to the crucible assembly of this embodiment, the internal pressure within the main body 10 is increased due to the structure of the inner plate 30, in which the path of the vapor M is bends and rotates by a total of 360 degrees. Therefore, a larger amount of internal pressure needs to be applied within the crucible assembly, thereby improving the stability of the deposition rate of the material. Further, it is possible to prevent an aperture formed in the crucible assembly from being blocked by sublimation of fusible material due to the increase in internal pressure. Furthermore, the inner plate 30 substantially serves as a dam by covering the opening 14 formed at the upper portion of the main body 10, so that it is possible to prevent fusible material from being splashed to an outside of the main body 10.

Since the inner plate 30 is not positioned within the main body 10, the capacity of solid material within the main body is not diminished by the presence of the inner plate 30. That is, a continuous operation time per one electric charge can be maximized based on the main body 10 having a predetermined volume and capacity.

Figure 5:
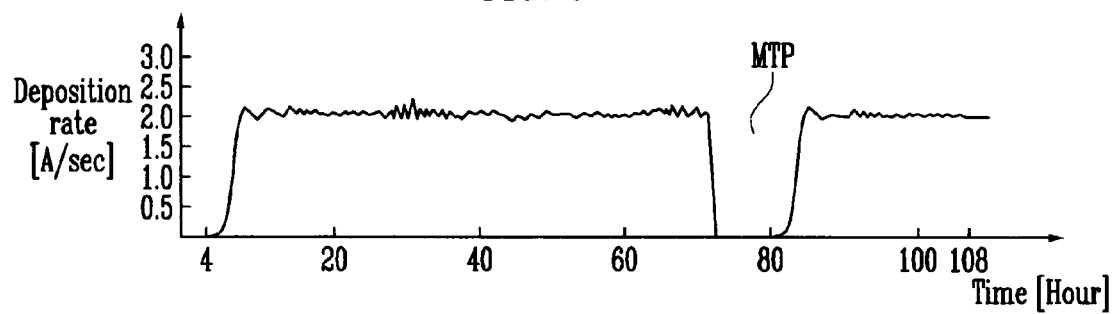
FIG. 5 is a graph showing a deposition rate of the crucible assembly for deposition according to the embodiment of the present invention.

Meanwhile, in this embodiment, the inlet 34a can be formed at only a central portion of the one surface of the base member, similar to the outlet 34b. In other words, the inlet 34a can be formed so that a portion of the first floor space 32a is not directly exposed from a bottom side of the inner plate 30. By doing so, the path that the vapor takes is longer than the case where the entirety of the first floor space is exposed to from a bottom side of the inner plate 30. Therefore, the internal pressure within main body 10 can be further increased by reducing the size of inlet 34a. As a result, the inner plate 30 can be designed so that a certain internal pressure will result Turning now to FIG. 5, FIG. 5 is a graph showing a deposition rate using the crucible assembly for deposition according to the embodiment of the present invention. Alq3 was used as the sublimation material.

As shown in FIG. 5, the sublimation material was inserted into the crucible assembly, and the crucible assembly was operated for 108 hours. After 54 hours of operation, the operation of the crucible assembly was temporarily stopped for a mask test period (MTP) of about 18 hours. After the MTP, operation of the crucible assembly resumed for the remaining 36 hours while the deposition rate was measured.

The deposition rate of the crucible assembly of this embodiment stably maintained about 2 Å/sec for the 108 hours alter being charged just once. As such, when using the crucible assembly for deposition having the inner plate of this embodiment, it is possible to prevent an aperture from being clogged by material because of the increased internal pressure within the main body of the crucible assembly, and therefore the deposition rate of the crucible assembly can be stably maintained for a long period of time.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A crucible assembly, comprising:
a main body having an inner space accommodating a deposition material and an opening arranged at an upper portion of the inner space;
a cap having an aperture arranged at a top of the main body and combined with the main body; and
an inner plate arranged between the main body and the cap, the inner plate covering the opening of the main body the crucible assembly including inner channels arranged to allow vapor of the deposition material from the inner space of the main body to be expelled to an outside of the aperture in the cap via a space arranged between an outer side surface of the inner plate and an inner side surface of the cap, wherein the inner plate comprises:
a base member;
a partition wall arranged at a middle portion of the base member in a thickness direction of the base member, the partition to partition an interior of the base member into first and second floor spaces:
an inlet allowing the first floor space to be exposed from a bottom side of the base member;
an outlet allowing the second floor space to be exposed from a top side of the base member;
a plurality of first channels to allow the first floor space to communicate with an outer side surface of the base member; and
a plurality of second channels to allow the second floor space to communicate with the outer side surface of the base member.

2. The crucible assembly of claim 1, wherein the inner channels are arranged to allow the vapor to sequentially flow through the inlet, the first floor space, the first channels, the outer side surface of the base member, the second channels, the second floor space and the outlet.

3. The crucible assembly of claim 1, wherein the first channels are radially arranged in a side surface of the base member.

4. The crucible assembly of claim 3, wherein the second channels are radially arranged in the side surface of the base member.

5. The crucible assembly of claim 1, wherein the inlet is arranged exposing an entirety of the first floor space from the bottom side of the base member.

6. The crucible assembly of claim 1, wherein the base member is comprised of a material selected from a group consisting of copper, beryllium copper and phosphor bronze.

7. The crucible assembly of claim 1, further comprising a heater to supply heat to the main body, the heater being adhered to an outer circumferential surface of the main body.

8. A crucible assembly comprising an inner plate, comprising:
    a base member;
    a partition wall arranged at a middle portion of the base member in a thickness direction of the base member, the partition wall to partition an interior of the base member into first and second floor spaces;
    an inlet to allow the first floor space to be exposed from a bottom side of the base member;
    an outlet to allow the second floor space to be exposed from a top side of the base member;
    a plurality of first channels allowing the first floor space to communicate with an outer side surface of the base member; and
    a plurality of second channels to allow the second floor space to communicate with the outer side surface of the base member,
    a plurality of inner channels being arranged to allow a fluid introduced through the inlet to sequentially flow through the inlet, the first floor space, the first channels, the outer side surface of the base member, the second channels, the second floor space and the outlet in order.

9. The crucible assembly of claim 8, wherein the first channels are radially arranged in a side surface of the base member.

10. The crucible assembly of claim 9, wherein the second channels are radially arranged in a side surface of the base member.

11. The crucible assembly of claim 8, wherein the inlet is arranged exposing an entirety of the first floor space from the bottom side of the base member.

12. The crucible assembly of claim 8, wherein the base member is comprised of a material selected from a group consisting of copper, beryllium copper and phosphor bronze.

* * * * *